United States Patent
Sakai

(10) Patent No.: US 6,409,838 B1
(45) Date of Patent: Jun. 25, 2002

(54) COATING FILM FORMATION APPARATUS AND AGING PROCESS APPARATUS

(75) Inventor: Koji Sakai, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/431,282

(22) Filed: Nov. 1, 1999

(30) Foreign Application Priority Data

Nov. 4, 1998 (JP) .......................................... 10-313117

(51) Int. Cl.$^7$ ............................................. C23C 16/00
(52) U.S. Cl. ...................................... 118/725; 118/715
(58) Field of Search ................................. 118/715, 725, 118/52, 59, 64, 66, 695, 692, 733

(56) References Cited

U.S. PATENT DOCUMENTS

| | | | |
|---|---|---|---|
| 4,986,216 A | * 1/1991 | Ohmori et al. ............. | 118/715 |
| 5,433,734 A | * 7/1995 | Miyagi et al. ............. | 118/715 |
| 5,470,802 A | * 11/1995 | Gnadi et al. | |

* cited by examiner

*Primary Examiner*—Brenda A. Lamb
(74) *Attorney, Agent, or Firm*—Oblon, Spivak, McClelland, Maier & Neustadt, P.C.

(57) ABSTRACT

An apparatus for forming a coating film, comprises a coating unit for coating a sol containing dielectric particles and a first solvent on a substrate, an aging unit for changing a sol-state coating film formed on the substrate in the coating unit to a gel state, and a solvent exchange unit for applying a second solvent different from the first solvent to the coating film to replace the first solvent in the coating film with the second solvent, wherein the aging unit comprises a heating plate for heating the substrate, a cover arranged in contact with a peripheral portion of the heating plate to form a process chamber surrounding the substrate, together with-the heating plate, a vacuum adsorption mechanism for vacuum-evacuating a contact surface between the cover and the heating plate to thereby adsorb the cover to the heating plate, a chemical solution vapor supply mechanism for supplying a chemical solution vapor to the process chamber, an evacuation mechanism for evacuating the process chamber to set an inner pressure of the process chamber at a negative value, and a process chamber pressure monitor for detecting an inner pressure of the process chamber.

22 Claims, 8 Drawing Sheets

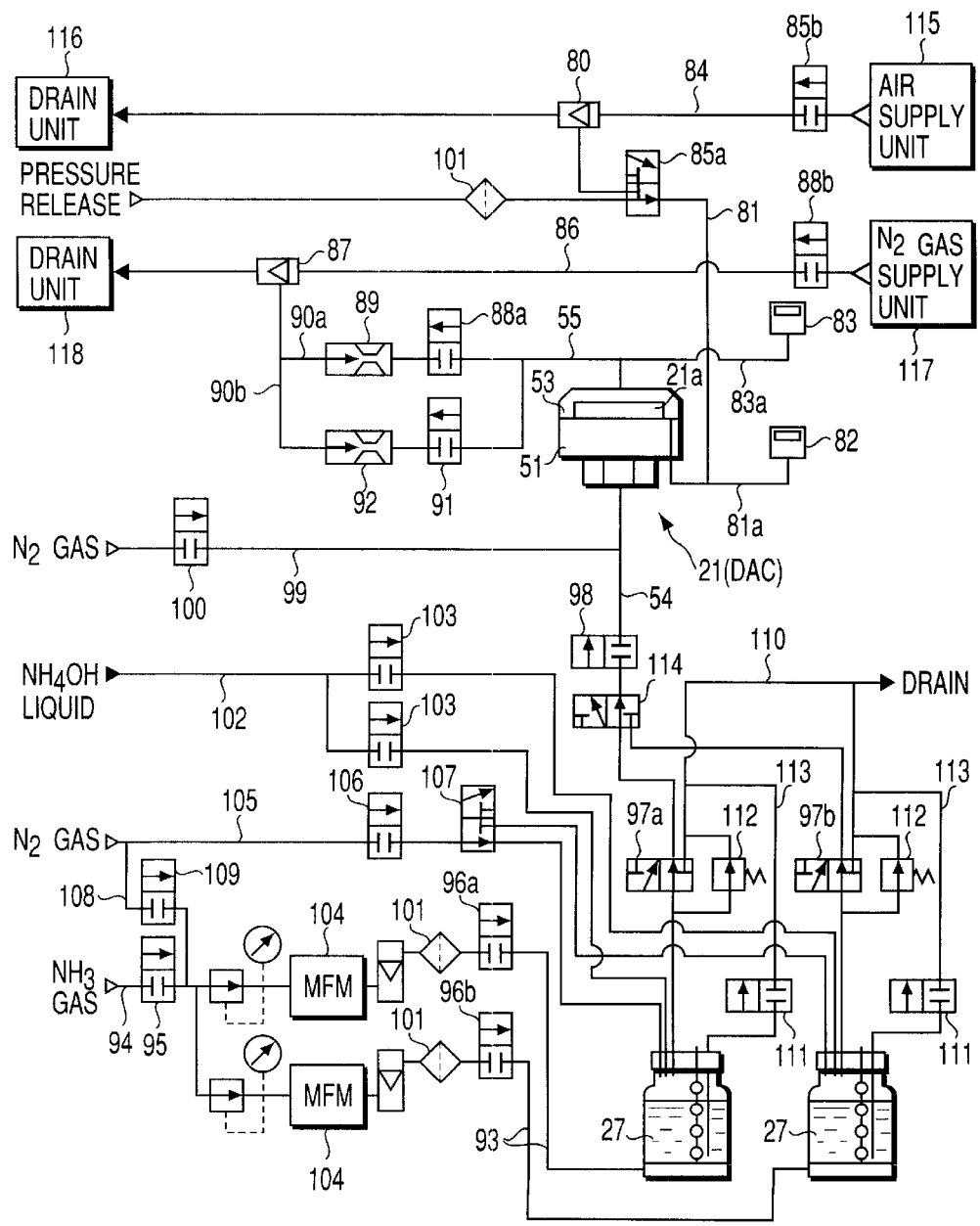
F I G. 10

COATING FILM FORMATION APPARATUS AND AGING PROCESS APPARATUS

BACKGROUND OF THE INVENTION

The present invention relates to an apparatus for forming a coating film for coating a sol on a substrate for forming a dielectric film and to an apparatus for aging a sol-state coating film to change to a gel-state coating film.

A manufacturing process for a semiconductor device includes a step of forming an interlayer dielectric film on a metal wiring layer or between the metal wiring layers made of aluminium or copper. The interlayer dielectric film is known to be formed by various methods including a Sol-Gel method, a SiLk method, a SPEED FILM method, and a FOx method.

In the Sol-Gel method, a sol (colloid solution) having TEOS (tetraetoxysilane; $Si(OC_2H_5)_4$) dispersed in an organic solvent, is spin-coated on a surface of a semiconductor wafer. Then, the coated sol is changed into a gel (Gel process). Furthermore, the solvent in the coating film is replaced with another solvent (solvent exchange process), dried and baked. Through these steps, a desired interlayer dielectric film is obtained. In the gelation step, for example, ammonia is used as a chemical solution. In the solvent exchange process step, ammonia or hexamethyldisilazane (HMDS) is used as the chemical solution.

The gel process is performed in an aging unit of the SOD (Spin on Dielectric) system. The process chamber of the aging unit is surrounded by a heating plate and a cover. The semiconductor wafer coated with a sol is first mounted on the heating plate. The process chamber is evacuated while ammonia is supplied into the process chamber, and a semiconductor wafer is heated by the heating plate, to e.g., 100° C. Through these steps, the coating film formed on the semiconductor wafer is changed from a sol to a gel.

The cover of the aging unit is vacuum-adsorbed to the heating plate by a vacuum adsorption mechanism. Therefore, when an inner pressure of the process chamber is significantly larger than an adsorption pressure of the vacuum adsorption mechanism, or when the inner pressure of the process chamber significantly decreases and becomes almost equal to the adsorption pressure of the vacuum adsorption mechanism, ammonia within the process chamber may leak outside. Since ammonia has a destructive effect on other processes including a post exposure baking (PEB) unit for a chemically amplified resist, leakage of ammonia outside from the aging unit must be prevented.

BRIEF SUMMARY OF THE INVENTION

An object of the present invention is to provide an apparatus for forming a coating film and an aging process apparatus capable of preventing leakage of gas from a process chamber even if an inner pressure of the process chamber greatly changes.

According to the present invention, there is provided an apparatus for forming a coating film, comprising:

a coating unit for coating a sol containing dielectric particles and a first solvent on a substrate;

an aging unit for changing a sol-state coating film formed on the substrate in the coating unit to a gel state; and a solvent exchange unit for applying a second solvent different from the first solvent to the coating film to replace the first solvent in the coating film with the second solvent, wherein the aging unit comprises
a heating plate for heating the substrate;
a cover arranged in contact with a peripheral portion of the heating plate to form a process chamber surrounding the substrate, together with the heating plate;
a vacuum adsorption mechanism for vacuum-evacuating a contact surface between the cover and the heating plate to thereby adsorb the cover to the heating plate;
a chemical solution vapor supply mechanism for supplying a chemical solution vapor to the process chamber;
an evacuation mechanism for evacuating the process chamber to set an inner pressure of the process chamber at a negative value; and
a process chamber pressure monitor for detecting an inner pressure of the process chamber.

According to the present invention, there is provided an aging process apparatus for receiving a substrate coated with a sol containing dielectric particles and a solvent and changing the sol-state film to a gel state film, comprising a heating plate for heating the substrate;
a cover arranged in contact with a peripheral portion of the heating plate to form a process chamber surrounding the substrate, together with the heating plate;
a vacuum adsorption mechanism for vacuum-evacuating a contact surface between the cover and the heating plate to thereby adsorb the cover to the heating plate;
a chemical solution vapor supply mechanism for supplying a chemical solution vapor to the process chamber;
an evacuation mechanism for evacuating the process chamber to set an inner pressure of the process chamber at a negative value; and
a process chamber pressure monitor for detecting an inner pressure of the process chamber.

According to the apparatus of the present invention, it is possible to detect the inner pressure of the process chamber by the process chamber pressure monitor. Therefore, since the abnormal inner pressure can be detected immediately upon the occurrence, on the basis of the obtained pressure detection data, it is possible to prevent leakage of the chemical solution vapor from the process chamber before the occurrence.

Furthermore, the aging unit preferably comprises
an inert gas supply mechanism for supplying an inert gas to the process chamber; and
control means for outputting an instruction signal to the chemical solution vapor supply mechanism for terminating supply of the chemical solution vapor; an instruction signal to the inert gas supply mechanism for initiating supply of an inert gas, and an instruction signal to the evacuation mechanism for evacuating the process chamber, when the process chamber pressure monitor detects a predetermined uppermost permissible pressure value or a predetermined lowermost permissible pressure value.

Furthermore, the aging unit preferably comprises
alarm means for giving an alarm when the process chamber pressure monitor detects a predetermined uppermost permissible pressure value or a predetermined lowermost permissible pressure value. Therefore, it is possible for an operator to deal with the abnormality immediately upon hearing the alarm. As a result, it is possible to inhibit enlargement of leakage before the chemical solution vapor leakage reaches other processes.

Furthermore, it is preferable that the aging unit should have an adsorption pressure monitor for detecting an adsorption pressure of the vacuum adsorption mechanism. In this case, it is further preferable that the aging unit should comprise an inert gas supply mechanism for supplying an inert gas to the process chamber; and control means for outputting an instruction signal to the chemical solution vapor supply mechanism for terminating supply of the chemical solution vapor, an instruction signal to the inert gas supply mechanism for initiating supply of an inert gas, and an instruction signal to the evacuation mechanism for evacuating the process chamber when the process chamber pressure monitor detects a predetermined uppermost permissible pressure value or a predetermined lowermost permissible pressure value.

Further, in this case, the aging unit preferably comprises an alarm means for giving an alarm when the process chamber pressure monitor detects a predetermined uppermost permissible PRESSURE value or a predetermined lowermost permissible pressure value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a block diagram showing a gas supply circuit and gas exhaust circuit of the aging unit (DAC);

DETAILED DESCRIPTION OF THE INVENTION

Now, various preferably embodiments of the present invention will be explained with reference to the accompanying drawings.

The SOD (Spin on Dielectric) system has a process section 1, a side cabinet 2, and a carrier station (CSB) 3. The process section 1 is provided between the side cabinet 2 and the carrier station (CSB) 3.

Figure 1A:
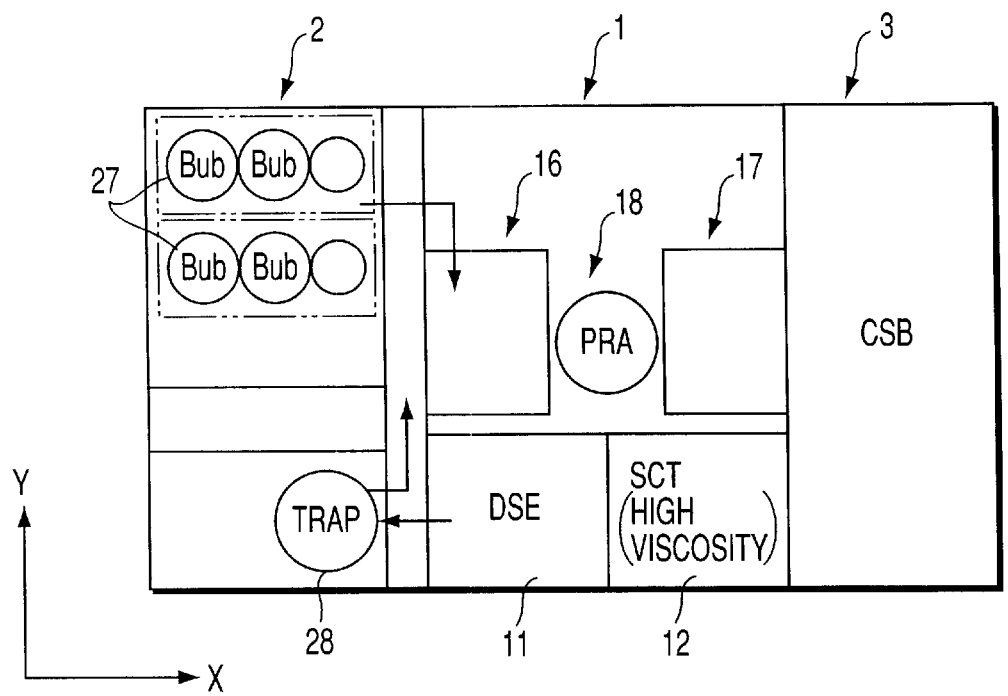
FIGS. 1A and 1B are schematic plan views respectively showing an upper stage and a lower stage of a coating film formation apparatus (SOD system) according to an embodiment of the present invention.
Figure 1B:
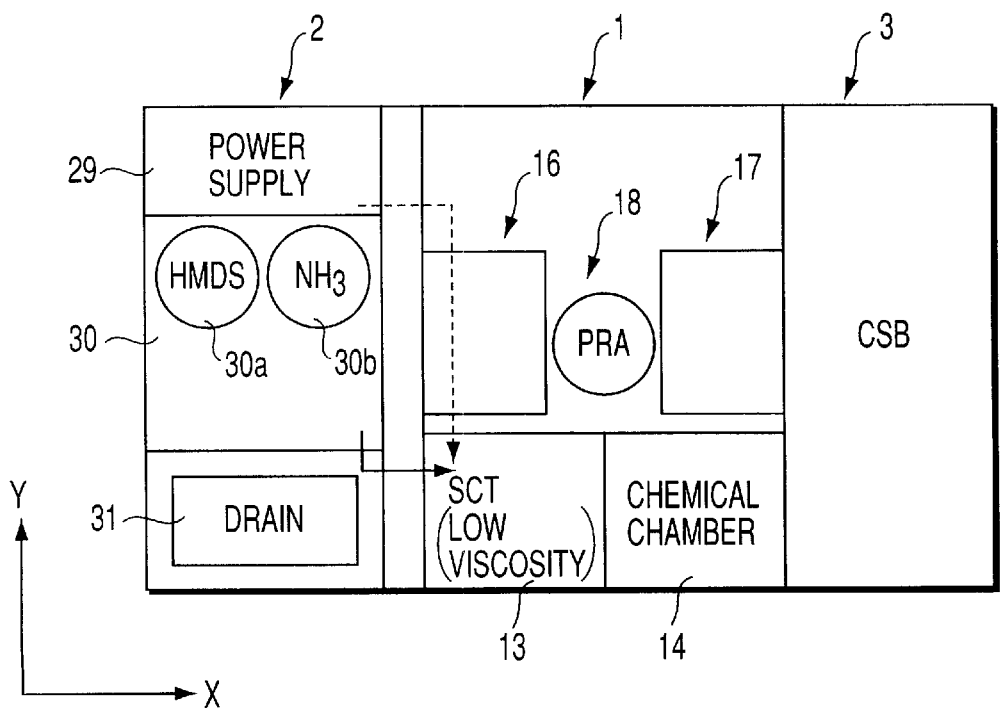
Figure 2:
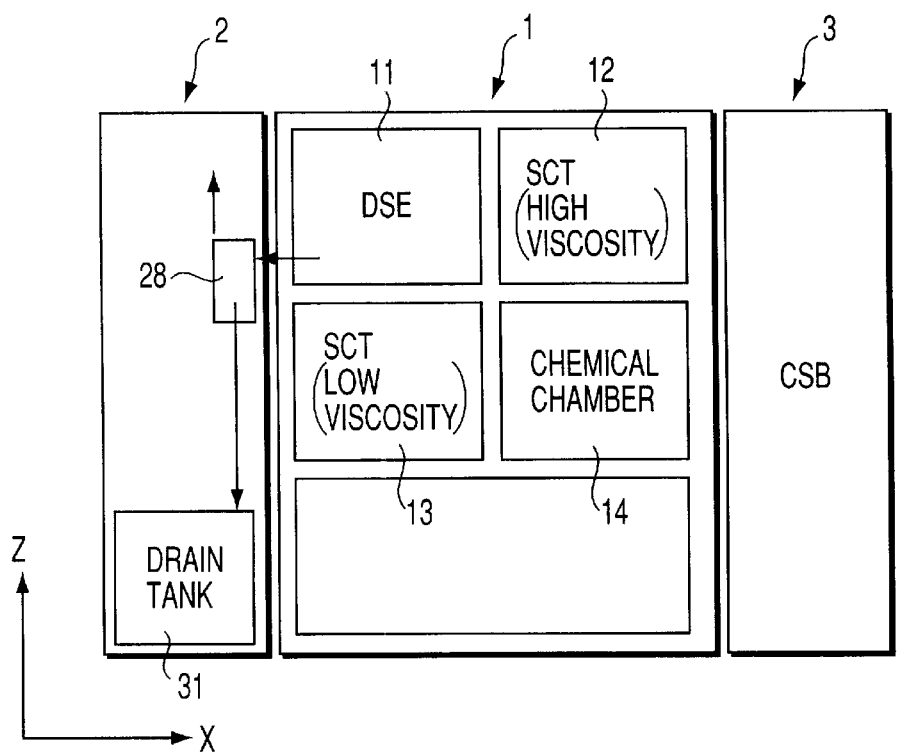
FIG. 2 is a schematic plan view showing various units arranged in a front surface of the coating film formation apparatus (SOD system)

As shown in FIGS. 1A and 2, a solvent exchange unit (DSE) 11 and a coating process unit (SCT) 12 are arranged at a front side in an upper stage of the process unit 1 . As shown in FIGS. 1B and 2, a coating process unit (SCT) 13 and a chemical chamber 14 are arranged at a front side in a lower stage of the process section 1. The coating process unit (SCT) 12 has a coating solution supply source (not shown) storing a high-viscosity coating solution. The coating process unit (SCT) 13 has a coating solution supply source 47 (refer to FIG. 4) storing a coating solution low in viscosity. The chemical chamber 14 stores various chemical solutions.

Figure 3:
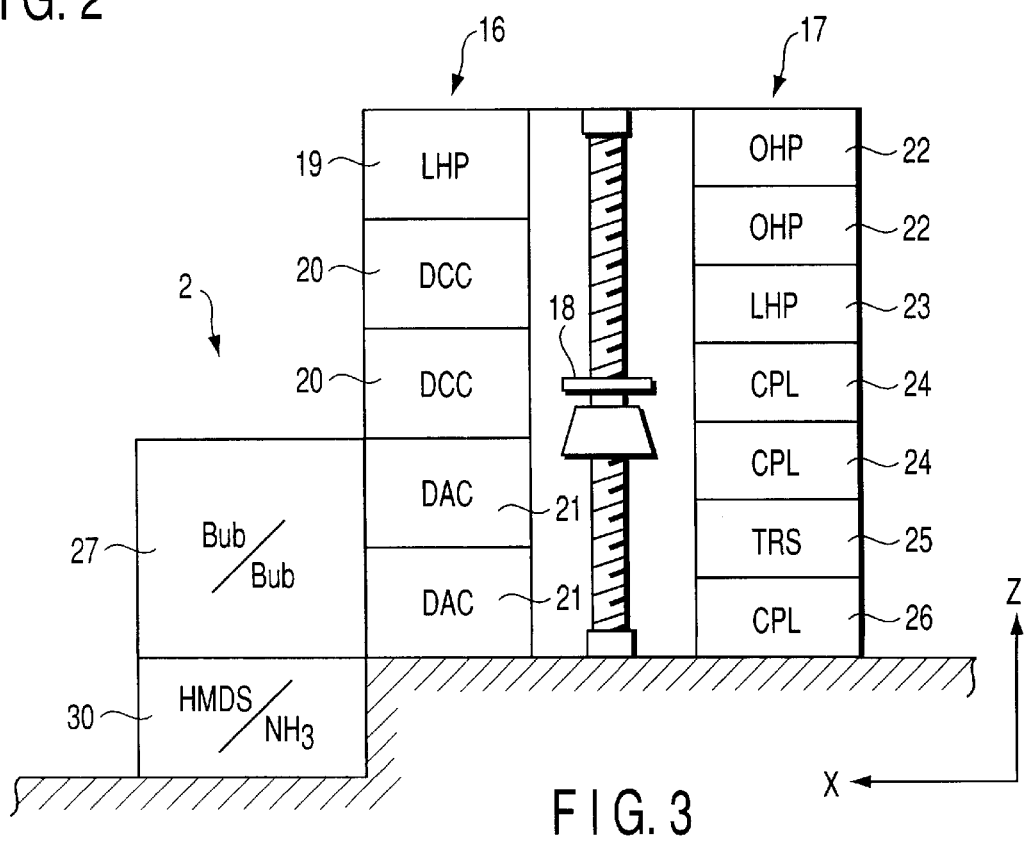
FIG. 3 is a schematic plan view showing various units arranged in a rear surface of the coating film formation apparatus (SOD system)

In a center portion of the process section 1, process unit groups 16, 17 and a transfer mechanism (PRA) 18 are provided as shown in FIGS. 1A and 1B. The process unit groups 16, 17 consist of a plurality of process units 19–26 which are stacked vertically in multiple stages, as shown in FIG. 3. The transfer mechanism 18 is liftably provided between the process unit group 16 and the process unit group 17 and responsible for transferring the wafer W to each of the process units 19, 20, 21, 22, 23, 24, 25, 26.

In the process unit group 16, a hot plate unit (LHP) 19 for low temperature heating, two DCC process units (Dielectric Oxygen Density Controlled Cure and Cooling off) 20 serving as a curing process unit and two aging units (DAC) 21 are arranged in this order from the above. In the process unit group 17, two hot plate units (OHP) 22 for high temperature heating, hot plate unit (LHP) 23 for low temperature heating, two cooling plate units (CPL) 24, a transfer unit (TRS) 25, and cooling plate unit (CPL) 26 are arranged in the order from the above. Note that the transfer unit (TRS) may have a cooling function.

As shown in FIG. 1A, four bubblers 27 are arranged at a rear side in an upper stage of the side cabinet 2. As shown in FIGS. 1B and 3, a power supply source 29 and a chemical solution chamber 30 are provided at the rear side in the lower stage. The chemical solution chamber 30 has a HMDS supply source 30a and an ammonia gas supply source 30b. A trap 28 is provided at a front side in the upper stage of the side cabinet 2. An exhaust gas from the DSE unit 11 is cleaned in the TRAP 28. A drain 31 is provided at the front side in the lower stage of the side cabinet 2. A waste solution from the TRAP 28 is discharged in the drain 31.

Figure 7:
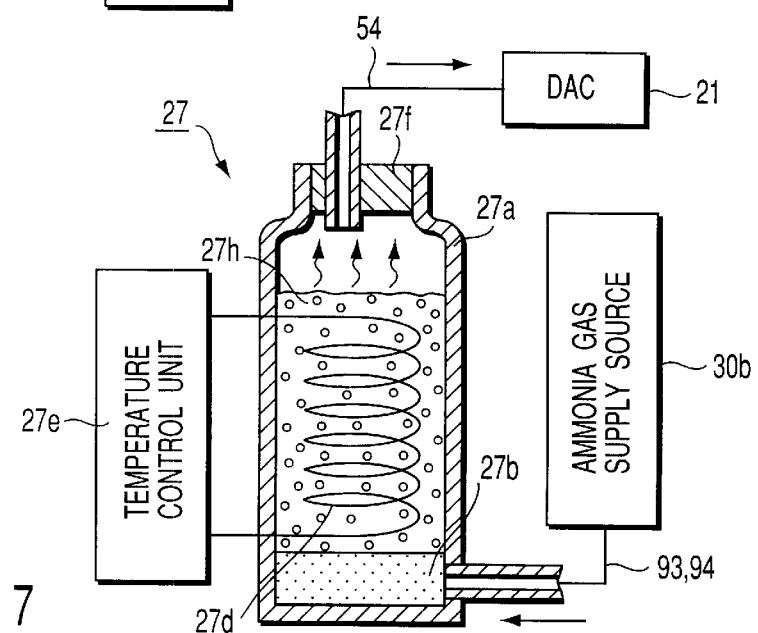
FIG. 7 is a schematic sectional view of a bubbler (Bub) with a block diagram of peripheral elements.

As shown in FIG. 7, the bubbler 27 has a vessel 27a storing ammonia water 27h, a porous plug 27b formed at a bottom of the vessel 27a, a thermal exchange portion 27d, and a cover 27f. The porous plug 27b is formed of porous ceramic and communicates with an ammonia gas supply source 30b of the chemical solution chamber 30 by way of pipe 93, 94. The thermal exchange portion 27d is dipped in ammonia water 27h contained in the vessel 27a and controlled by a temperature control unit 27e. A vapor generating section (upper space) of the vessel 27a communicates with the aging unit (DAC) 21 by way of a pipe 54. Ammonia gas is supplied from the gas supply source 30b to a porous plug 27b. When ammonia gas is blown into ammonia water 27h, bubbling with the gas occurs, with the result that water vapor ($H_2O$) containing a hydroxyl group (OH—) is generated. The water vapor ($H_2O$) containing a hydroxyl group (OH—) is supplied to the aging unit (DAC) 21 through the pipe 54. The bubbler 27 is desirably arranged near the process unit group 16 including the heating process unit in order to prevent condensation of the generated water vapor. Furthermore, the side cabinet 2 is desirably arranged at the longest possible distance from the carrier station (CSB) 3 so that ammonia or HMDS does not have an effect upon the side cabinet 2.

The carrier station (CSB) 3 has a cassette mounting table (not shown) and a sub-transfer mechanism (not shown). A plurality of wafer cassettes are mounted on the cassette mounting table. A cassette is loaded and unloaded into the cassette mounting table by a transfer robot (not shown). The cassette stores unprocessed semiconductor wafers W or processed semiconductor wafers W. The sub transfer mechanism takes out an unprocessed wafer W and transfers it into a unit (TRS) 25 of the process section 1, and then receives a processed wafer W from the unit (TRS) 25 and loads into the cassette.

Then, we will explain a case where an interlayer dielectric film is formed by using the SOD system in accordance with the Sol-Gel method.

In the Sol-Gel method, a wafer W is processed in the cooling plates (CPL) 24, 26, second coating process unit (SCT) 13, aging unit (DAC) 21, solvent exchange unit (DSE) 11, hot plates (LHP) 19, 23 and hot plate (OHP) 22 in this order mentioned. When the interlayer dielectric film is formed by the Sol-Gel method, the second coating process unit (SCT) 13, the aging unit (DAC) 21, and the solvent exchange unit (DSE) 11 are mainly used.

Next, the coating process unit (SCT) 13 for low-viscosity coating solution will be explained with reference to FIG. 4.

The coating process unit (SCT) 13 has a nozzle 46 communicating with a supply source 47 storing a low-viscosity coating solution. The low-viscosity coating solution is a sol solution consisting of TEOS colloid or particles dispersed in an organic solvent, to which water and a small-amount hydrochloric acid are further added. The process space 13a of the coating process unit (SCT) 13 is surrounded by a cover 41 and a cup 42. A vacuum chuck 45 is provided in the space 13a. The cover 41, which is movably and swingably supported by a moving mechanism (not shown), closes an upper opening of the cup 42. When the cover 41 is opened, the wafer W is mounted on the transfer mechanism 18 on a vacuum chuck 45.

The vacuum chuck 45 has an absorption hole communicating with a vacuum evacuation unit (not shown) and supported by a driving shaft 44 attached to the bottom of the cup 42 by way of a bearing 44a. The driving shaft 44 is rotatably and liftably connected by means of a driving portion 43. A nozzle 46 is attached to a center portion of the cover 41 and moved together with the cover 41.

A plurality of pipes 48 communicating with a solvent vapor supply source 49 pass through a side peripheral portion of the cup 42, for supplying ethylene glycol vapor to the process space 13a. Ethylene glycol is a solvent used in a coating solution. openings of a drain pipe 49 and an exhaust pipe 50 are formed at the bottom of the cup 42. Note that the coating solution and the solvent to be used in the unit 13 are supplied from the chemical chamber 14. The chemical chamber 14 stores a chemical solution such as ammonia and HMDS. Since the supply sources such as ammonia and HMDS have an adverse effect upon the unit 13, it is isolated from other portions in the chemical chamber 14. Note that a coating process unit (SCT) 12 for a high-viscosity solution and a coating process unit (SCT) 13 for a low-viscosity solution, are formed in the same structure.

Figure 5:
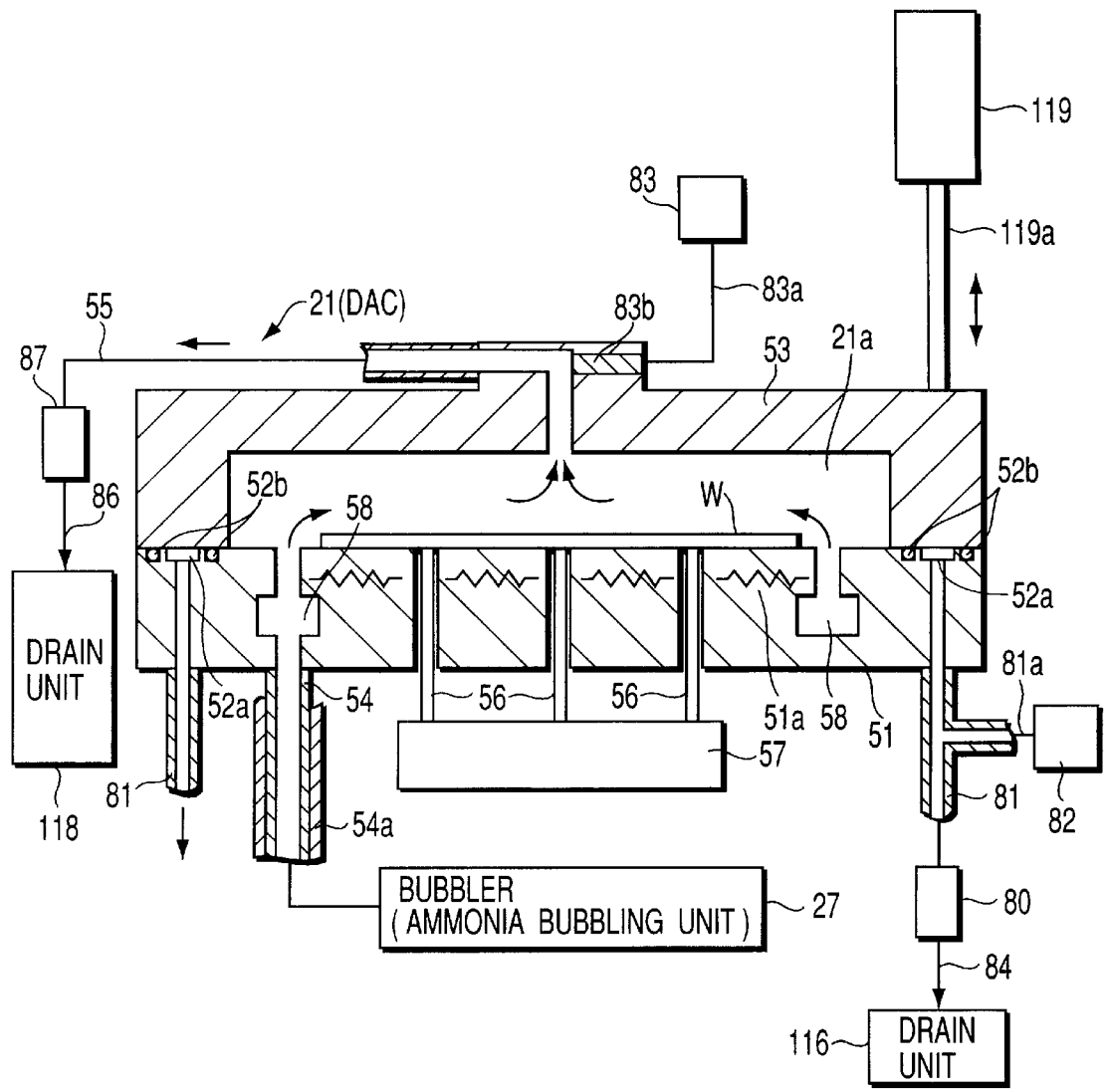
FIG. 5 is a perspective sectional view schematically showing an aging unit (DAC)

Referring now to FIG. 5, the aging unit (DAC) 21 will be explained.

A process chamber 21a of the aging unit (DAC) 21 is surrounded by a heating plate 51 and a cover 53. The heating plate 51 is made of ceramic in which a heater 51a connecting to a power supply source (not shown) is embedded. Three lift pins 56 are liftably supported by a cylinder mechanism 57 so as to protrude from an upper surface of the heating plate 51.

The cover 53 is liftably supported by a cylinder 119. When the rod 119a is retracted into the cylinder 119, the cover 53 moves up and leave from the heating plate 51, with the result that the process chamber 21a is opened. In this state, the substrate transfer mechanism 18 transfers the wafer W to three lift pins 56. When the lift pins 56 are moved down, the wafer W approaches to or comes into contact with the heating plate 51. When the rod 119a is allowed to protrude from the cylinder 119, the cover 53 moves down and comes into contact with a peripheral portion of the heating plate 51. As a result, the process chamber 21a is shut out from outer air.

A ring-form vacuum adsorption groove 52a and two sealing grooves 52b are formed on a peripheral surface of the heating plate 51. The vacuum adsorption groove 52a is interposed between a pair of sealing grooves 52b and communicates with a vacuum adsorption pipe 81. A seal ring is inserted in each of the sealing grooves 52b. The vacuum adsorption pipe 81 communicates with a drain unit 116 by way of an injector 80 and a vacuum exhaust pipe 84. A branched pipe 81a is branched out from the vacuum adsorption pipe 81. The branched pipe 81a is equipped with a pressure monitor 82 serving as a first pressure detection means. The vacuum adsorption pressure to press the cover 53 against the heating plate 51 is detected by the first pressure monitor 82.

An opening of a flow passage of an exhaust pipe 55 is formed at a center of the cover 53 to evacuate the process chamber 21a. The exhaust pipe 55 communicates with a drain unit 118 through an injector 87 and a vacuum exhaust pipe 86. The exhaust pipe 55 is equipped with a detection terminal 83b of a pressure monitor 83 serving as a second pressure detection means. The detection terminal 83b communicates with the pressure monitor 83 by way of a communication pipe 83a. The inner pressure of the process chamber 21a is detected by the second pressure monitor 83.

An opening of a ring-form gas flow passage 58 is formed on an upper surface of the heating plate 51. Ammonia gas is supplied through the passage 58 to the peripheral portion of the wafer W. The ring-form gas flow passage 58 communicates with the bubbler 27 by way of the pipe 54. Since the pipe 54 is wound with a tape heater 54a, it is possible to prevent condensation of ammonia gas (ammonia vapor) within the pipe 54 caused by heating. Note that the drain unit 118 communicating with the exhaust pipe 55 includes a drain tank 31 in the side cabinet 2.

As shown in FIG. 10, air is supplied to the injector 80 of the exhaust pipe 84 from an air supply unit 115 through a valve 85a. The supplied air is exhausted into the drain unit 116 through the injector 80. Nitrogen gas is sent to the injector 87 of the exhaust pipe 86 by way of a valve 88b from the $N_2$ gas supply unit 117, passed through the injector 87, and exhausted to the drain unit 118.

The flow passages of the vacuum adsorption pipe 81 are switched by the switching valve 85a. One of the flow passages communicates with the injector 80 of the exhaust pipe 84. The other flow passage is opened to air through a filter 101. The cover 53 is brought into tight contact with the heating plate 51 by allowing the vacuum adsorption pipe 81 to communicate with the injector 80 by the first switching valve 85a. On the other hand, the cover 53 is released from the heating plate 51 by allowing the vacuum adsorption pipe 81 to communicate with an open air line by operating the first switching valve 85a.

The exhaust pipe 55 communicates with the injector 87 by way of two flow passages 90a, 90b which are exchangeably used by switching from each other. The passage 90a is equipped with a second switching valve 88a and a flow rate control valve 89 (needle valve). The passage 90b is equipped with a third switching valve 91 and a flow rate control valve 92 (needle valve). The flow passage 90b is used as a bypass. Each of the flow rate control valves 89, 92 can control and set an exhaust flow rate.

When the second switching valves 88a, 88b are OFF, $N_2$ gas is not supplied to the vacuum exhaust pipe 86. Therefore, the process chamber 21a is not evacuated through the exhaust pipe 55. Whereas, the second switching valves 88a, 88b are ON, the exhaust pipe 55 communicates with the injector 87, at the same time, $N_2$ gas is supplied to the vacuum exhaust pipe 86. As a result, the process chamber 21a is evacuated through the exhaust pipe 55. Furthermore, when the third switching valve 91 is turned ON, the process chamber 21a is also evacuated through the bypass pipe 90b. As a result, an exhaust flow rate from the process chamber 21a increases.

Now, referring to FIGS. 3, 7, and 10, we will explain the relationship between the aging unit (DAC) and the bubbler 27.

The aging unit (DAC) 21 is arranged next to a plurality of bubblers 27 of the side cabinet 2. Ammonia gas is supplied to each of the bubblers 27 through supply pipes 93, 94 from a supply source (not shown). The supply pipe 94 communicates with ammonia gas supply source (not shown). The supply pipe 94 is branched out into a plurality of pipes 93, each communicating with the corresponding bubbler 27.

The supply pipe 94 is equipped with a fourth switching valve 95. The supply pipes 93 are equipped with fifth switching valves 96a, 96b, respectively. These switching valves 95, 96a, 96b are appropriately switched when ammonia gas is blown into each of the bubblers 27.

A supply pipe 102 communicating with an ammonia solution supply source (not shown) is connected to each of the bubblers 27. Each of the ammonia solution supply pipes 102 is equipped with a switching valve 103. Ammonia solution is supplied to each of the bubbler 27 by way of the corresponding supply pipe 102.

Furthermore, as a nitrogen gas purge line of the bubbler 27, a supply pipe 105 communicating with a $N_2$ gas supply source (not shown) and an exhaust pipe 110 communicating with a drain unit (not shown) are provided. The nitrogen gas supply pipe 105 is equipped with switching valves 106, 107. Nitrogen gas is purged from each of the bubblers 27 at a maintenance/inspection time. The exhaust pipe 110 communicates with each of the bubblers 27 through the corresponding bypass pipes 113. Each of the bypass pipes 113 is equipped with a switching valve 111.

Furthermore, the exhaust pipe 110 is equipped with sixth switching valves 97a, 97b for exhausting ammonia vapor into a drain unit (not shown) when the inner pressure of the bubbler 27 exceeds a permissible pressure.

Furthermore, the supply pipe 54 to the process chamber 21a is equipped with a seventh switching valve 98 for switching influent and effusion of the ammonia vapor. Furthermore, the supply pipe 54 communicates with a $N_2$ gas supply pipe 99 connected to a $N_2$ gas supply source (not shown).

The supply pipe 99 is equipped with an eighth switching valve 100 for switching influent and effusion of $N_2$ gas. Note that a merge valve 114 is provided immediately upstream of the seventh switching valve 98. Ammonia vapor is introduced into the supply pipe 54 from each of the bubblers 27 through the merge valve 114.

Figure 6:
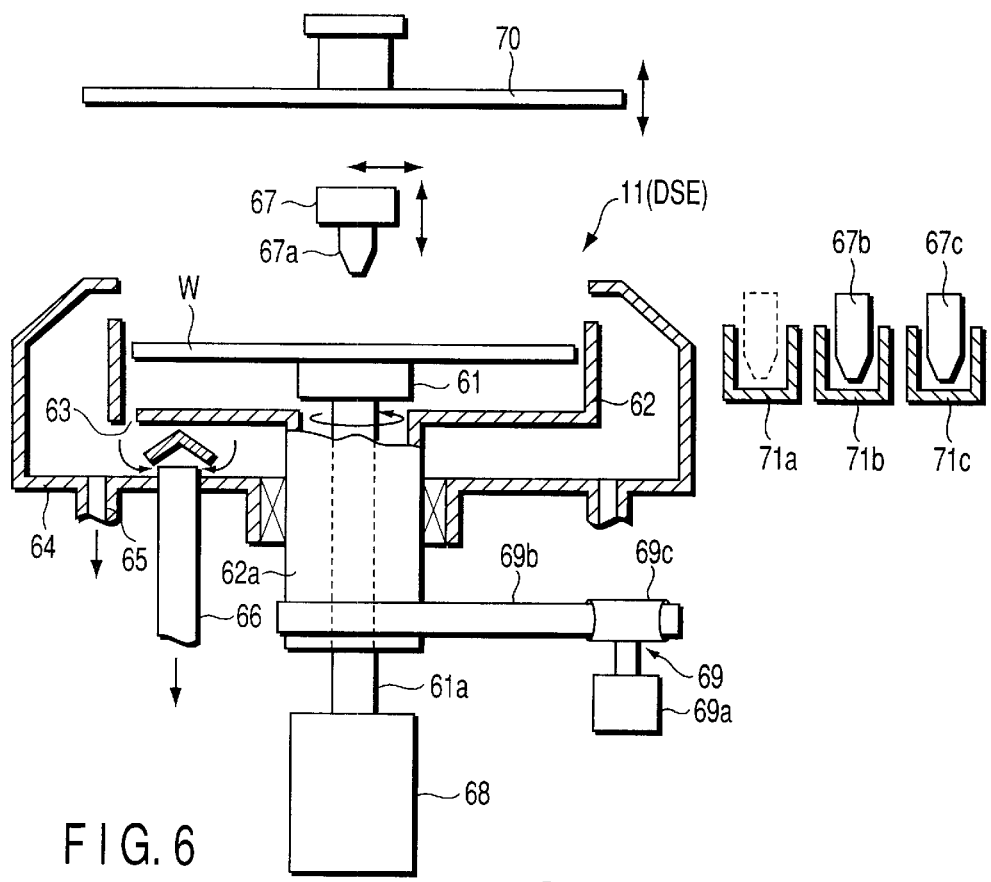
FIG. 6 is a perspective sectional view schematically showing a solvent exchange unit (DSE)

As shown in FIG. 6, the solvent exchange unit (DSE) 11 has a vacuum chuck 61, a rotation cup 62, a fixed cup 64, and a nozzle portion 67. An adsorption hole (not shown) communicating with a vacuum evacuation unit (not shown) is formed in an upper surface of the vacuum chuck 61. A lower portion of the vacuum chuck 61 is connected to a driving shaft 61a of a motor 68. A power source of the motor 68 (not shown) is connected to a controller 100 to control a rotation speed of the vacuum chuck 61.

A lower portion 62a of the rotation cup is a hollow tube. A belt 69b of the rotation drive mechanism 69 is stretched between the lower portion 62a of the rotation cup and a pulley 69c to transmit a rotation driving force from a motor 69a to the rotation cup 62. Note that a driving shaft 61a is connected to the vacuum chuck 61 through a hollow portion of the rotation cup lower portion 62a. Furthermore, a drainage hole 63 is formed at the bottom of the cup 62 so as to surround the wafer W on the chuck 61.

The fixed cup 64 is provided so as to surround the rotation cup 62. A discharge passage 65 and an exhaust passage 66 are discretely formed at the bottom of the fixed cup 64. Drainage liquid drops and mist are discharged from the bottom opening 63 of the rotation cup to the fixed cup 64.

The nozzle portion 67 has three exchangeable nozzles 67a, 67b, 67c. The first nozzle 67a communicates with an ethanol supply source (not shown). The second nozzle 67b communicates with a HMDS supply source. The third nozzle 67c communicates with a heptane supply source (not shown). These exchangeable nozzles 67a, 67b, 67c are allowed to stand-by at respective nozzle receipt portions 71a, 71b, 71c provided in a home position. The nozzles 67a, 67b, 67c are taken out selectively from the respective nozzle receipt portions 71a, 71b, 71c by a nozzle chuck mechanism (not shown) and transferred above a rotation center of the wafer W. Such a nozzle chuck mechanism is disclosed in, for example, U.S. Pat. No. 5,089,305.

When HMDS is supplied to the second nozzle 67b, HMDS is directly supplied from the HMDS tank 30a of the side cabinet 2. A gas-liquid mixture is discharged from the cup 64 to a mist trap 28 through an exhaust passage 66 to separate gas from liquid. Furthermore, the waste water is discharged from the-cup 64 through a discharge passage 65 to a drain tank 31.

The side cabinet 2 is provided next to the process section 1 while isolated therefrom. The bubbler 27 for supplying a chemical solution and a mist-trap (TRAP) 28 for discharging an exhaust gas by separating it from the gas-liquid mixture are provided in an upper stage of the side cabinet 2. The power supply source 29, chemical solution chambers 30 for storing chemical solutions such as HMDS and ammonia, and the drain 31 are arranged in a lower stage of the side cabinet 2.

When an alkaline vapor is supplied to the aging unit (DAC) 21, ammonia gas is blown from the tank 30b to the bubbler 27 to bubble the ammonia water in the bubbler 27. When HMDS is supplied to the solvent exchange unit (DSE) 11, HMDS is directly supplied from the tank 30a to the unit 11.

The exhaust gas from the aging unit (DAC) 21 is trapped by a drain tank 31 in the side cabinet 2. Furthermore, the exhaust gas mixed with liquid derived from the solvent exchange unit (DSE) 11 is separated into a gaseous component and a liquid component by the mist trap 28 in the cabinet 2 and the liquid component is discharged into the drain tank 31.

Since the aging unit (DAC) 21 and the solvent exchange unit (DSE) 11 are provided next to the side cabinet 2, a pipe for chemical solution supply can be shortened.

Immediately (e.g., within 10 seconds) after a sol solution is coated onto the wafer W, gelation process is preferably applied to change a sol state to a gel state. Therefore, as shown in FIGS. 1–3, the coating unit (SCT) 13 for a low viscosity coating solution and the aging unit (DAC) 21 are adjoined to each other. Since it is preferable that a solvent is immediately exchanged after the gelation process, the aging unit (DAC) 21 and the solvent exchange unit (DSE) 11 are adjoined to each other.

Note that the DCC process unit 20 is used for curing a coating film in the SiLK method, SPEED FILM method or FOx method, however, it is not required in the Sol-Gel method. The coating process unit (SCT) 12 is used for coating a high-viscosity coating solution but is not usually used in the Sol-Gel method.

Next, a case where an interlayer dielectric film is formed by the Sol-Gel method will be explained with reference to FIGS. 8A–8C and 9.

First, a particulate material of tetraetoxysilane (TEOS) is prepared as alkoxide (Step S1). The TEOS particulate material is weighed (Step S2). Then, the TEOS particulate material is added to a solvent to prepare a sol having a predetermined composition (Step S3). As the solvent, any one of solvents including water, 4-methyl-2-pentanone, ethylalcohol, cyclohexanone and 1-Methoxy-2-Propanol, is used. Furthermore, water and a small-amount of hydrochloric acid are added to the sol to adjust the concentration of the sol to a final desired concentration (Step S4).

Figure 8A:
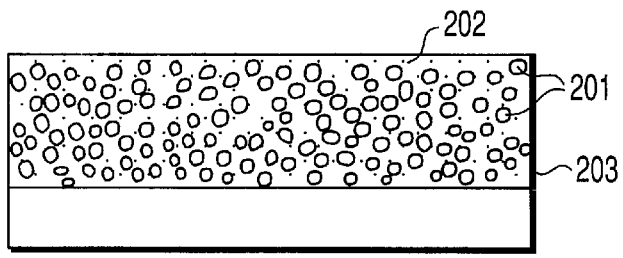
FIG. 8A is a schematic sectional view showing a sol-state coating film in a Sol-Gel method.

The sol thus prepared is stored in the coating solution supply source 47 of the coating process unit 13. The wafer W is held by the vacuum chuck 45. While the cover 41 is closed and a solvent vapor is supplied from the vapor supply source 49 into the cup 42, the cup 42 is evacuated. The wafer W is rotated, a sol is supplied to the wafer W from the nozzle 46 and spin-coated on the wafer W (Step S5). In this manner, a coating film having TEOS particles or colloid 201 dispersed in a solvent 202 is formed as shown in FIG. 8A. In this case, if a sol supply amount, a wafer rotation speed, a wafer temperature, a sol temperature, a solvent vapor supply amount, and a cup evacuation amount are individually controlled, the coating film can be formed in a desired thickness. It is desirable that the solvent vapor supplied from the solvent vapor supply source 49 should have the same composition as that of the solvent.

Figure 8B:
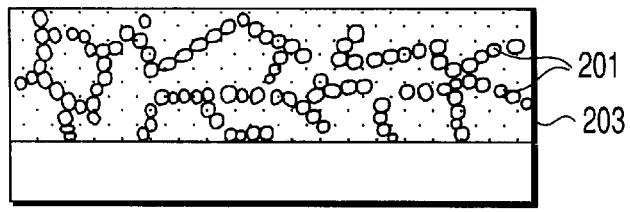
FIG. 8B is a schematic sectional view showing a gel-state coating film.

Then, the wafer W is transferred to the aging unit (DAC) 21 in which an alkaline vapor is applied to a coating film 203. Due to this, TEOS present in the coating film 203 is condensed and simultaneously hydrolyzed. As a result, a reticulated structure 201 is formed, as shown in FIG. 8B. In this manner, the coating film 203 is changed from a sol to a gel (Step S6).

Then, the wafer W is transferred to the solvent exchange unit (DSE) 11 and another solvent 204 is applied to the coating film 203 therein. The solvent 202 present in the coating film 203 is replaced with another solvent 204 (Step S7). Through this step, a moisture content of the coating film 203 is substantially removed. As the solvent 204 used as a replacement solvent, 3-pentanone is used.

Figure 8C:
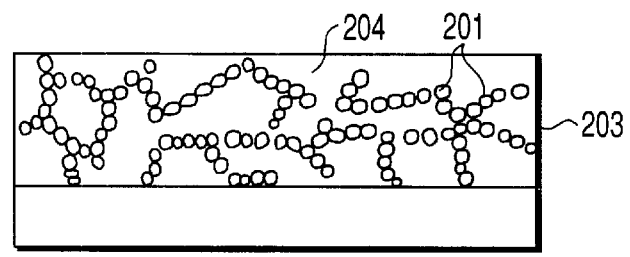
FIG. 8C is a schematic sectional view of a coating film in which an initial solvent is replaced with another solvent.
Figure 9:
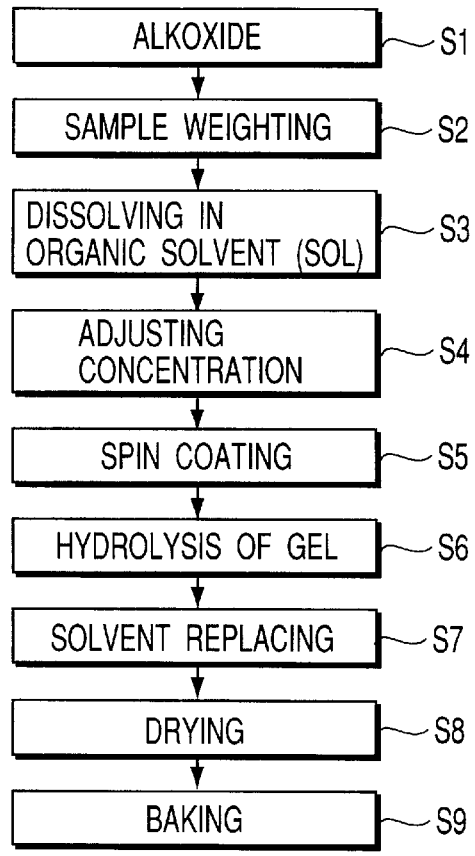
FIG. 9 is a flow chart showing an example of a Sol-Gel process.
Figure 11:
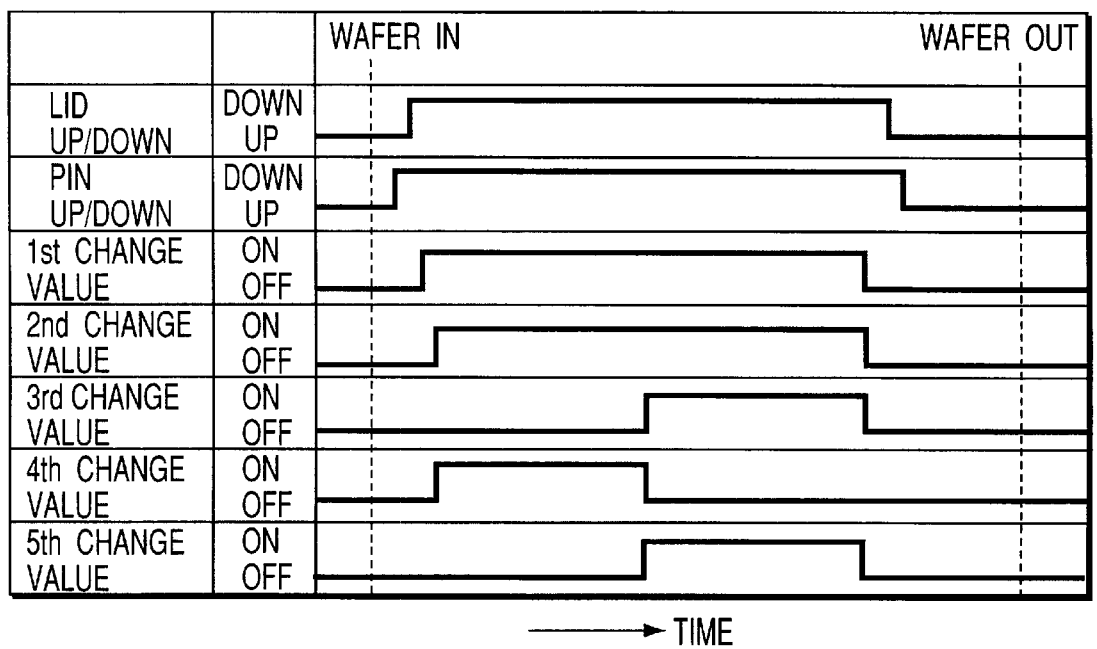
FIG. 11 is a timing chart showing an operation of the aging unit (DAC)
Figure 12:
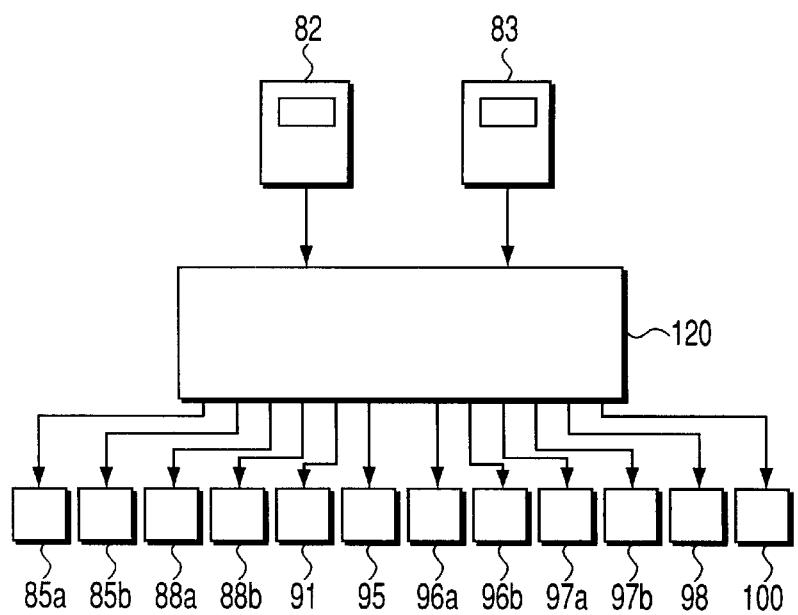
FIG. 12 is a control circuit including a controller, first and second pressure monitors, various switching valves.

Then, the wafer W is heated by the hot plate (LHP) 23 at a low temperature to dry the coating film (Step S8). Furthermore, the wafer W is heated by the hot plate (OHP) 22 at a high temperature to bake the coating film (Step S9). The coating film thus baked serves as an interlayer dielectric film, as shown in FIG. 8C.

Now, we will explain how to operate the SOD system in the case where the interlayer dielectric film is formed by the Sol-Gel method.

A wafer W transferred from the carrier station (CSB) 3 to the transfer section (TRS) 25 is transferred by the transfer mechanism 18 to the cooling plates (CRL) 24, 26 and cooled therein. In this manner, differences in temperature of the wafer surface before coating can be reduced. It is therefore possible to form the resultant film uniformly in thickness and quality.

Figure 4:
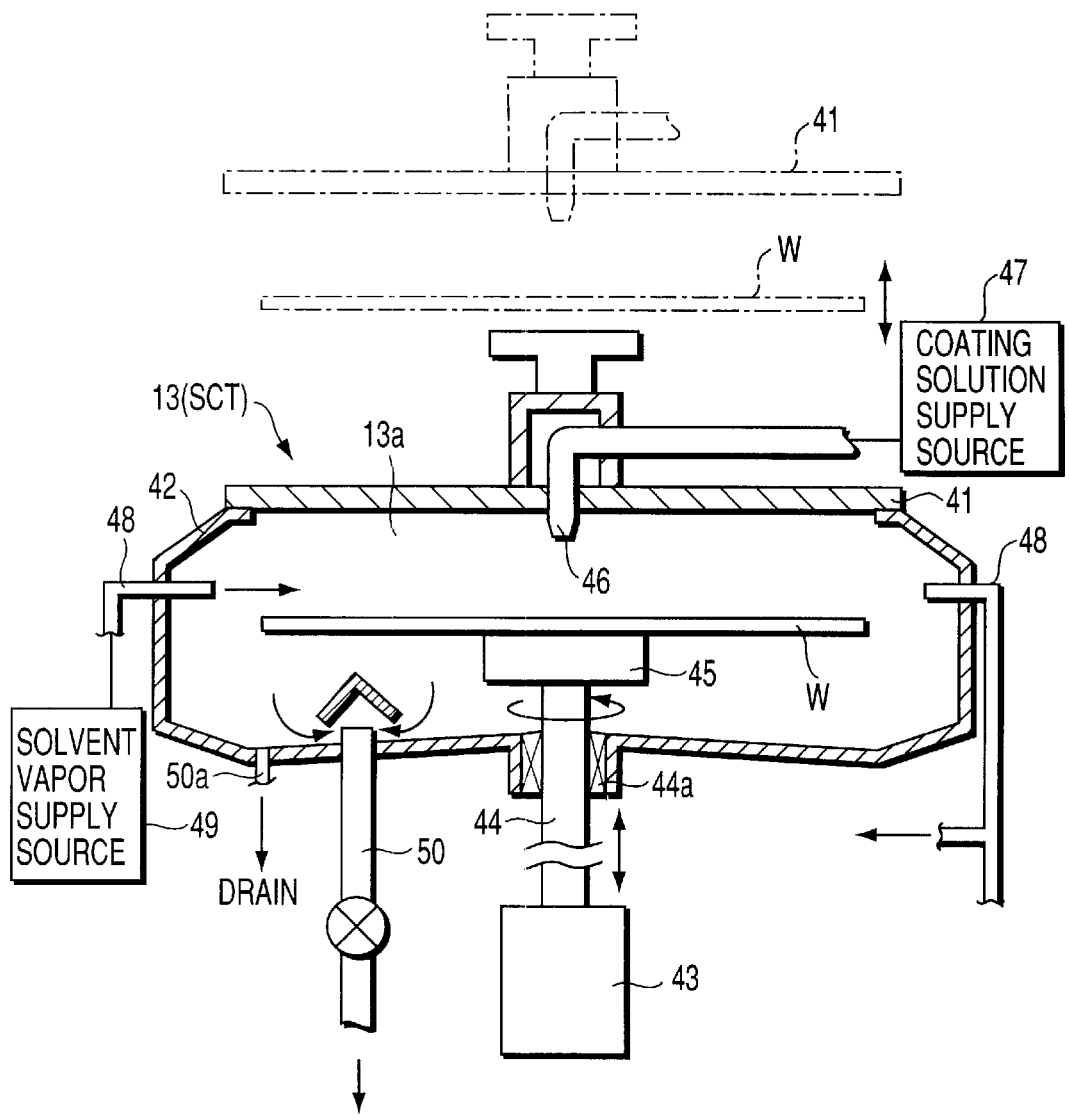
FIG. 4 is a perspective sectional view schematically showing a coating process unit (SCT) for a low viscosity solution.

Then, the wafer W is transferred to a coating process unit (SCT) 13 and then passed to the chuck 45 as shown in FIG. 4. Then, the rotation cup 42 is closed airtight by the cover 41. The coating solution used in the coating process unit 13 is a low viscosity solution formed of TEOS colloid or particles dispersed in an organic solvent, to which water and a small amount of hydrochloric acid are further added. While the rotation cup 4 is evacuated through the exhaust pipe 50, the vapor of the organic solvent is supplied from the solvent vapor supply pipe 48 to the rotation cup 42 to fill the rotation cup 42 with the organic solvent vapor. Thereafter, the evacuation is terminated and the coating solution is supplied dropwise from the nozzle 46 to a center portion of the wafer W. Then, while the wafer W is rotated by the chuck 45, the coating solution is spread over the entire surface of the wafer W. As a result, a coating film is formed. As described, the reason why the coating process is performed while the rotation cup 42 is filled with the organic solvent vapor is to suppress vaporization of the solvent from the coating solution.

The wafer W having a coating film thus formed thereon is transferred to the aging unit (DAC) 21. Since it is preferable to perform a gelation treatment for changing a sol to a gel immediately after the coating solution is coated on the wafer W, the aging unit (DAC) 21 is desirably arranged next to the coating process unit (SCT) 13 for a low viscosity solution.

In the aging unit (DAC) 21, the process chamber 21a is evacuated through the exhaust pipe 55 while the cover 53 is vacuum-adsorbed onto the heating plate 51, as shown in FIG. 5; at the same time, ammonia gas is supplied to the process chamber 21a from the bubbler 27 through the pipe 54. At this time, the wafer W is heated to about 100° C. In this manner, the sol coated on the wafer W is changed into a gel.

Then, the wafer W is transferred to the solvent exchange unit (DSE) 11. In this case, it is preferable to replace a solvent immediately after the gelation treatment. Therefore, the aging unit (DAC) 21 and the solvent exchange unit (DSE) 11 are arranged next to each other.

In the solvent exchange unit (DSE) 11, the wafer W is transferred to the vacuum chuck 61 as shown in FIG. 6. Then, a water soluble chemical agent, e.g., ethanol, is supplied dropwise to a center of the wafer W from an exchange nozzle 67a of the nozzle 67. While the wafer W and the rotation cup 62 are rotated, ethanol is spread over the entire surface of the wafer W. Ethanol is dissolved in the moisture content of the coating film, with the result that the moisture content is replaced with ethanol.

Then, a cover 70 is opened and HMDS is supplied to the center portion of the wafer w in the same manner. In this way, a hydroxy salt contained in the coating film is removed. Furthermore, heptane is supplied dropwise to the wafer W to replace the solvent contained in the coating film with heptane. The reason why heptane is used is to reduce the force to be applied to a porous construct, e.g, the TEOS reticulate construct 201, by using a solvent having a small surface tension, thereby preventing destruction thereof.

Thereafter, the wafer W is heated by the hot plates (LHP) 19, 23 to a low temperature region and heated by the hot plate (OHP) 22 to a high temperature region. In the two-step baking, an interlayer dielectric film is completed. The wafer W is finally returned to the carrier station (CSB) 3 through a transfer section (TCP) 25.

Now, operation of the aging unit (DAC) 21 will be explained with reference to FIGS. 5, 10, 11 and 12.

A wafer W is loaded into the aging unit 21 by the substrate transfer mechanism 18. Then, the cover 53 is moved down to come into contract with the heating plate 51. As a result, the process chamber 21a is closed airtight. Subsequently, the first switching valves 85a and 85b are turned ON to allow the adsorption pipe 81 to communicate with the vacuum exhaust pipe 84. In this way, vacuum operation of the adsorption pipe 81 is initiated to adsorb the cover 53 to the heating plate 51.

Next, the second switching valves 88a, 88b are turned ON to allow the exhaust pipe 55 to communicate with the vacuum exhaust pipe 86. In this manner, vacuum operation of the exhaust pipes 55, 90a is initiated to evacuate the process chamber 21a. The evacuation pressure through the exhaust pipes 55, 90a is controlled by a flow control valve 89 (needle valve).

In the middle point of a gelation process, the third switching valve 91 is turned on to evacuate the process chamber 21a through the bypass pipe 90b. The evacuation amount from the process chamber 21a is about two times larger than that of the beginning. Therefore, in the later period of the gelation process, the evacuation amount from the process chamber 21a is greatly increased.

When ammonia gas is blown into ammonia solution within the bubbler 27, the fourth switching valve 95 is turned ON at the operation initiation time. At the middle time point of the gelation process, the fourth switching valve 95 is turned off and simultaneously the fifth switching valves 96a, 96b are turned on. Note that the seventh switching valve 98 is turned on when the ammonia vapor is supplied to the process chamber 21a through the supply pipe 54.

Next, we will explain how to operate when an inner pressure of the process chamber 21a exhibits an abnormal value. The following operations are performed by a controller 120.

When the second process monitor 83 detects a pressure larger than an uppermost permissible pressure value, an alarm is given by an alarm means (not shown). Simultaneously, the second switching valves 88a, 88b, the third switching valve 91, the fourth switching valve 95, the fifth switching valves 96a, 96b, the seventh switching valve 98, and the eighth switching valve 100 are switched from the ON state to the OFF state. The valves which have been placed in the OFF state are maintained as they are. The uppermost permissible value is set at a value which is larger than vacuum adsorption pressure between the heating plate 51/cover 53 and at which ammonia vapor does not leak from the process chamber 21a.

Then, the second switching valves 88a, 88b and the third switching valve 91 are turned ON to increase an evacuation amount from the process chamber 21a. Simultaneously, the eighth switching valve 100 is turned ON to supply $N_2$ gas into the process chamber 21a. In this manner, the atmosphere including ammonia vapor in the process chamber 21a is replaced with $N_2$ gas, with the result that leakage of the ammonia vapor from the process chamber 21a can be prevented without failure.

When the second pressure monitor 83 detects a pressure lower than the lowermost permissible pressure value, an alarm is given by the alarm means (not shown). At the same time, the second switching valve 88a, 88b, the third switching valve 91, the fourth switching valve 95, the fifth switching valves 96a, 96b, the seventh switching valve 98 and the eighth switching valve 100 are changed from an ON state to an OFF state. If they have already been in the OFF state, they are maintained as they are. The lowermost permissible value is set at a value equal to the vacuum adsorption pressure between the heating plate 51 and the cover 53.

Then, the eighth switching valve 100 is turned ON to fill the process chamber 21a with $N_2$ gas to a normal pressure. Then, the second switching valves 88a, 88b and the third switching valve 91 are turned ON to increase an evacuation amount from the process chamber 21a. At the same time, the eighth witching valve 100 is turned ON to supply $N_2$ gas into the process chamber 21a. In this manner, ammonia vapor in the process chamber 21a is replaced with $N_2$ gas. As a result, the leakage of the ammonia vapor from the process chamber 21a can be prevented without failure.

When the first pressure monitor 82 detects the uppermost permissible pressure value, an alarm is given by the alarm means (not shown). Simultaneously, the second switching valves 88a, 88b, the third switching valve 91, the fourth switching valve 95, the fifth switching valves 96a, 96b, the seventh switching valve 98 and the eighth switching valve 100 are changed from the ON state to the OFF state. If they have been in the OFF state, they are maintained as they are.

Then, the second switching valves 88a, 88b and the third switching valve 91 are changed to the ON state to increase the exhaust amount from the process chamber 21a. At the same time, the eighth switching valve 100 is changed to the ON state to supply $N_2$ gas into the process chamber 21a. In this manner, the atmosphere including ammonia vapor in the process chamber 21a is replaced with $N_2$ gas, with the result that leakage of ammonia vapor from the process chamber 21a can be prevented without failure.

According to the aforementioned embodiments, when an abnormal inner pressure of the process chamber 21a is detected and when an abnormal vacuum adsorption pressure between the heating plate 51 and the cover 53 is detected, on the basis of the pressure detection results checked by the first and second pressure monitors 82, 83, the abnormal condition can be detected immediately upon the occurrence. In addition, an alarm is given by the alarm means. It is therefore possible to prevent the leakage of the chemical solution vapor before it occurs.

When the abnormal condition is detected by either the first pressure monitor 82 or the second pressure monitor 83, the inner atmosphere of the process chamber 21a is immediately replaced with $N_2$ gas. Therefore, it is possible to prevent the leakage of ammonia vapor from the process chamber 21a without failure.

In the apparatus according to the aforementioned embodiment, the HMDS tank 30a, the ammonia tank 30b, and the side cabinet 2 having the bubbler 29 are arranged next to the process section 1 having the aging unit (DAC) 21 and the solvent exchange unit (DSE) 11. It is therefore possible to shorten the chemical solution supply pipe 54. As a result, condensation on the chemical solution supply pipe 54 can be prevented and simultaneously a possibility for leakage of ammonia and HMDS outside can be greatly reduced. In addition, the chemical solution supply system (29, 30a, 30b) is surrounded by the side cabinet 2 and thereby isolated from the process section 1. Therefore, even if the chemical solution supply system 29, 30a, 30b is arranged next to the process section 1, the system does not have an adverse effect on the process section 1.

Since the mist trap (TRAP) 28 and the drain 31 are not placed in the process section 1 but placed in the side cabinet 2, the exhaust gas and the discharge solution rarely have an adverse effect upon the process section 1.

As described above, since the chemical solution supply system 29, 30a, 30b which has a possibility of having an adverse effect upon other processes and the side cabinet 2 having an exhaust air/discharge solution process system 28, 31 are arranged next to the process section 1, it is possible to prevent an adverse effect upon the process without failure.

The present invention is not limited to the aforementioned embodiments and may be modified in various ways. For example, the substrate to be processed is not limited to a semiconductor wafer. Another substrate such as an LCD substrate may be used. The film to be formed is not limited to the interlayer dielectric film. In the embodiments mentioned above, the aging apparatus having a cover fixed airtight on the heating plate is exemplified. However, the aging apparatus is not limited to this structure. Furthermore, in the aforementioned embodiments, ammonia is used in the aging unit (DAC) 21, and HMDS and heptane are used in the solvent exchange unit (DSE) 11. However, the present invention is not limited thereto.

As explained in the foregoing, according to the present invention, a process chamber pressure monitor (second pressure monitor) is provided for detecting an inner pressure of the process chamber when the aging operation is carried out. It is therefore possible to detect an abnormal inner pressure of the process chamber immediately upon the occurrence and to prevent the leakage of the chemical solution vapor from the process chamber before it occurs.

In this case, a control means is provided for outputting an instruction to the chemical solution supply means for terminating supply of the chemical solution vapor, and an instruction to the inert gas supply means for initiating supply of an inert gas, at the same time, outputting an instruction to the evacuation means for evacuating the process chamber, when the process chamber pressure monitor (second pressure monitor) detects the uppermost value or the lowermost value. It is therefore possible to replace the atmosphere including the chemical solution vapor in the process chamber with the inert gas without failure when the abnormal pressure is detected in the process chamber. As a result, the leakage of the chemical solution vapor from the process chamber can be securely prevented.

Furthermore, a control means is provided for outputting an instruction to the chemical solution supply means to terminate the supply of the chemical solution vapor and an instruction to the inert gas supply means to initiate supply of the inert gas, at the same time, an instruction to the evacuation means for evacuating the process chamber, thereby replacing the process chamber with the inert gas when the process chamber pressure monitor (second pressure monitor) detects the uppermost value or the lowermost value or when the adsorption pressure monitor (first pressure monitor) detects the predetermined uppermost value.

It is therefore possible to replace the chemical solution vapor in the process chamber with an inert gas when the abnormal pressure is detected in the process chamber or when the tight contact between the cover and the heating plate is insufficient. As a result, the leakage of the chemical solution vapor from the process chamber can be securely prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for forming a coating film, comprising:
   a coating unit for coating a sol containing dielectric particles and a first solvent on a substrate;
   an aging unit for changing a sol-state coating film formed on the substrate in the coating unit to a gel state; and
   a solvent exchange unit for applying a second solvent different from the first solvent to the coating film to replace the first solvent in the coating film with the second solvent,
   wherein the aging unit comprises
      a heating plate, which supports the substrate substantially horizontally, for use in heating the substrate;
      a cover having a peripheral portion that is in contact with a peripheral portion of the heating plate to form a process chamber surrounding the substrate, together with the heating plate;
      a cylinder mechanism configured to press the cover against the heating plate;
      an annular groove formed in the peripheral portion of the heating plate;
      a vacuum adsorption mechanism having an exhaust passage communicating with the annular groove, for vacuum--evacuating the annular groove, thereby adsorbing the cover to the heating plate;
      a chemical solution vapor supply mechanism for supplying a chemical solution vapor to the process chamber;
      an evacuation mechanism for evacuating the process chamber to set an inner pressure of the process chamber at a negative value; and
      a process chamber pressure monitor for detecting an inner pressure of the process chamber.

2. The apparatus according to claim 1, wherein the aging unit further comprises
   an inert gas supply mechanism for supplying an inert gas to the process chamber; and
   control means for outputting an instruction signal to the chemical solution vapor supply mechanism for terminating supply of the chemical solution vapor; an instruction signal to the inert gas supply mechanism for initiating supply of an inert gas, and an instruction signal to the evacuation mechanism for evacuating the process chamber, when the process chamber pressure monitor detects a predetermined uppermost permissible pressure value or a predetermined lowermost permissible pressure value.

3. The apparatus according to claim 1, wherein the aging unit further comprises
   alarm means for giving an alarm when the process chamber pressure monitor detects a predetermined uppermost permissible pressure value or a predetermined lowermost permissible pressure value.

4. The apparatus according to claim 1, wherein the aging unit further comprises
   an adsorption pressure monitor for detecting an adsorption pressure of the vacuum adsorption mechanism.

5. The apparatus according to claim 4, wherein the aging unit further comprises
   an inert gas supply mechanism for supplying an inert gas to the process chamber; and
   control means for outputting an instruction signal to the chemical solution vapor supply mechanism for terminating supply of the chemical solution vapor; an instruction signal to the inert gas supply mechanism for initiating supply of an inert gas, and an instruction signal to the evacuation mechanism for evacuating the process chamber when the process chamber pressure monitor detects a predetermined uppermost permissible pressure value or a predetermined lowermost permissible pressure value.

6. The apparatus according to claim 5, wherein the aging unit further comprises
   alarm means for giving an alarm when the process chamber pressure monitor detects a predetermined uppermost permissible pressure value or a predetermined lowermost permissible pressure value.

7. The apparatus according to claim 1, wherein the evacuation mechanism comprises
   an exhaust pipe communicating with the process chamber;
   a switching valve and a flow rate control valve attached to the exhaust pipe;
   a bypass pipe branched out from the exhaust pipe; and
   another switching valve and another flow rate control valve attached to the bypass pipe.

8. An aging process apparatus for receiving a substrate coated with a sol containing dielectric particles and a solvent and changing a sol-state coating film to a gel state coating film, comprising
   a heating plate, which supports the substrate substantially horizontally, for use in heating the substrate;
   a cover having a peripheral portion that is in contact with a peripheral portion of the heating plate and forming a process chamber for surrounding the substrate, together with the heating plate;
   a cylinder mechanism configured to press the cover against the heating plate;
   an annular groove formed in the peripheral portion of the heating plate;
   a vacuum adsorption mechanism having an exhaust passage communicating with the annular groove, for vacuum-evacuating the annular groove, thereby adsorbing the cover to the heating plate;
   a chemical solution vapor supply mechanism for supplying a chemical solution vapor into the process chamber;
   an evacuation mechanism for evacuating the process chamber to set an inner pressure of the process chamber at a negative value; and
   a process chamber pressure monitor for detecting an inner pressure of the process chamber.

9. The apparatus according to claim 8, further comprising:
   an inert gas supply mechanism for supplying an inert gas to the process chamber;
   control means for outputting an instruction signal to the chemical solution vapor supply mechanism for terminating supply of the chemical solution vapor; an instruction signal to the inert gas supply mechanism for initiating supply of an inert gas, and an instruction signal to the evacuation mechanism for evacuating the process chamber when the process chamber pressure monitor detects a predetermined uppermost permissible pressure value or a predetermined lowermost permissible pressure value.

10. The apparatus according to claim 8, further comprising
    alarm means for giving an alarm when the process chamber pressure monitor detects a predetermined uppermost permissible pressure value or a predetermined lowermost permissible pressure value.

11. The apparatus according to claim 8, further comprising an adsorption pressure monitor for detecting an adsorption pressure of the vacuum adsorption mechanism.

12. The apparatus according to claim 11, further comprising
    an inert gas supply mechanism for supplying an inert gas to the process chamber; and
    control means for outputting an instruction signal to the chemical solution vapor supply mechanism for terminating supply of the chemical solution vapor; an instruction signal to the inert gas supply mechanism for initiating supply of an inert gas, and an instruction signal to the evacuation mechanism for evacuating the process chamber when the process chamber pressure monitor detects a predetermined uppermost permissible pressure value or a predetermined lowermost permissible pressure value.

13. The apparatus according to claim 12, further comprising alarm means for giving an alarm when the process chamber pressure monitor detects a predetermined uppermost permissible pressure value or a predetermined lowermost permissible pressure value.

14. The apparatus according to claim 8, wherein the evacuation mechanism comprises
    an exhaust pipe communicating with the process chamber;
    a switching valve and a flow rate control valve attached to the exhaust pipe;
    a bypass pipe branched out from the exhaust pipe; and
    another switching valve and another flow rate control valve attached to the bypass pipe.

15. An apparatus for forming a coating film, comprising:
    a coating unit for coating a sol containing dielectric particles and a first solvent on a substrate;
    an aging unit for changing a sol-state coating formed on the substrate in the coating unit to a gel state; and
    a solvent exchange unit for applying a second solvent different from the first solvent to the coating film to replace the first solvent in the coating film with the second solvent, wherein the aging unit comprises:
a heating plate, which supports the substrate substantially horizontally, for use in heating the substrate;
a cover configured to have a peripheral portion to be in contact with a peripheral portion of the heating plate to form a process chamber surrounding the substrate, together with the heating plate;
a cylinder mechanism for pressing the cover against the heating plate;
an annular groove formed in the peripheral portion of the heating plate;
a vacuum adsorption mechanism configured to have an exhaust passage communicating with the annular groove, for vacuum-evacuating the annular groove, thereby adsorbing the cover to the heating plate;
a chemical solution vapor supply mechanism for supplying a chemical solution vapor to the process chamber;
an evacuation mechanism for evacuating the process chamber to set an inner pressure of the process chamber at a negative value;
a process chamber pressure monitor for detecting an inner pressure of the process chamber;
an inert gas supply mechanism for supplying an inert gas to the process chamber; and
control means for outputting an instruction signal to the chemical solution vapor supply mechanism for terminating supply of the chemical solution vapor; an instruction signal to the inert gas supply mechanism for initiating supply of an inert gas, and an instruction signal to the evacuation mechanism for evacuating the process chamber, when the process chamber pressure monitor detects a predetermined uppermost permissible pressure value or a predetermined lowermost permissible pressure value.

16. An apparatus for forming a coating film, comprising:
a coating unit for coating a sol containing dielectric particles and a first solvent on a substrate;
an aging unit for changing a sol-state coating film formed on the substrate in the coating unit to a gel state; and
a solvent exchange unit for applying a second solvent different from the first solvent to the coating film to replace the first solvent in the coating film with the second solvent,
wherein the aging unit comprises:
a heating plate, which supports the substrate substantially horizontally, for use in heating the substrate;
a cover configured to have a peripheral portion to be in contact with a peripheral portion of the heating plate to form a process chamber surrounding the substrate, together with the heating plate;
a cylinder mechanism for pressing the cover against the heating plate;
an annular groove formed in the peripheral portion of the heating plate;
a vacuum adsorption mechanism configured to have an exhaust passage communicating with the annular groove, for vacuum-evacuating the annular groove, thereby adsorbing the cover to the heating plate;
a chemical solution vapor supply mechanism for supplying a chemical solution vapor to the process chamber;
an evacuation mechanism for evacuating the process chamber to set an inner pressure of the process chamber at a negative value;
a process chamber pressure monitor for detecting an inner pressure of the process chamber;

wherein the aging unit further comprises an adsorption pressure monitor for detecting an adsorption pressure of the vacuum adsorption mechanism.

17. The apparatus according to claim 16, wherein the aging unit further comprises:
an inert gas supply mechanism for supplying an inert gas to the process chamber; and
control means for outputting an instruction signal to the chemical solution vapor supply mechanism for terminating supply of the chemical solution vapor; an instruction signal to the inert gas supply mechanism for initiating supply of an inert gas, and an instruction signal to the evacuation mechanism for evacuating the process chamber when the process chamber pressure monitor detects a predetermined uppermost permissible pressure value or a predetermined lowermost permissible pressure value.

18. The apparatus according to claim 17, wherein the aging unit further comprises:
alarm means for giving an alarm when the process chamber pressure monitor detects a predetermined uppermost permissible pressure value or a predetermined lowermost permissible pressure value.

19. An aging process apparatus for receiving a substrate coated with a sol containing dielectric particles and a solvent and changing a sol-state coating film to a gel state coating film, comprising
a heating plate, which supports the substrate substantially horizontally, for use in heating the substrate;
a cover configured to have a peripheral portion to be in contact with a peripheral portion of the heating plate and forming a process chamber for surrounding the substrate, together with the heating plate;
a cylinder mechanism for pressing the cover against the heating plate;
an annular groove formed in the peripheral portion of the heating plate;
a vacuum adsorption mechanism configured to have an exhaust passage communicating with the annular groove, for vacuum-evacuating the annular groove, thereby adsorbing the cover to the heating plate;
a chemical solution vapor supply mechanism for supplying a chemical solution vapor into the process chamber;
an evacuation mechanism for evacuating the process chamber to set an inner pressure of the process chamber at a negative value;
a process chamber pressure monitor for detecting an inner pressure of the process chamber;
an inert gas supply mechanism for supplying an inert gas to the process chamber; and
control means for outputting an instruction signal to the chemical solution vapor supply mechanism for terminating supply of the chemical solution vapor; an instruction signal to the inert gas supply mechanism for initiating supply of an inert gas, and an instruction signal to the evacuation mechanism for evacuating the process chamber when the process chamber pressure monitor detects a predetermined uppermost permissible pressure value or a predetermined lowermost permissible pressure value.

20. An aging process apparatus for receiving a substrate coated with a sol containing dielectric particles and a solvent and changing a sol-state coating film to a gel state coating film, comprising
a heating plate, which supports the substrate substantially horizontally, for use in heating the substrate;

a cover configured to have a peripheral portion to be in contact with a peripheral portion of the heating plate and forming a process chamber for surrounding the substrate, together with the heating plate;

a cylinder mechanism for pressing the cover against the heating plate;

an annular groove formed in the peripheral portion of the heating plate;

a vacuum adsorption mechanism configured to have an exhaust passage communicating with the annular groove, for vacuum-evacuating the annular groove, thereby adsorbing the cover to the heating plate;

a chemical solution vapor supply mechanism for supplying a chemical solution vapor into the process chamber;

an evacuation mechanism for evacuating the process chamber to set an inner pressure of the process chamber at a negative value;

a process chamber pressure monitor for detecting an inner pressure of the process chamber; and further comprising an adsorption pressure monitor for detecting an adsorption pressure of the vacuum adsorption mechanism.

21. The apparatus according to claim 20, further comprising an inert gas supply mechanism for supplying an inert gas to the process chamber; and control means for outputting an instruction signal.

22. The apparatus according to claim 21, further comprising alarm means for giving an alarm when the process chamber pressure monitor detects a predetermined uppermost permissible pressure value or a predetermined lowermost permissible pressure value.

* * * * *